United States Patent [19]

Edwards et al.

[11] Patent Number: 5,760,595
[45] Date of Patent: Jun. 2, 1998

[54] HIGH TEMPERATURE ELECTROMIGRATION STRESS TEST SYSTEM, TEST SOCKET, AND USE THEREOF

[75] Inventors: Robert Daniel Edwards, Marlboro, N.Y.; Du Binh Nguyen, Danbury, Conn.; James Joseph Poulin, Poughquag, N.Y.; Hazara Singh Rathore, Stormville, N.Y.; Richard George Smith, Poughkeepsie, N.Y.

[73] Assignee: International Business Machines Corporation, Armonk, N.Y.

[21] Appl. No.: 715,942

[22] Filed: Sep. 19, 1996

[51] Int. Cl.$^6$ .................................................. G01R 31/02
[52] U.S. Cl. ..................... 324/703; 324/760; 324/538; 219/209; 438/14
[58] Field of Search .................... 437/8; 219/209, 219/210; 324/716, 760, 755, 765, 185.1, 703

[56] References Cited

U.S. PATENT DOCUMENTS

| | | |
|---|---|---|
| 4,963,517 | 10/1990 | Goto et al. . |
| 5,030,905 | 7/1991 | Figal ........................... 324/760 |
| 5,266,895 | 11/1993 | Yamashita . |
| 5,434,385 | 7/1995 | Biery et al. . |
| 5,436,567 | 7/1995 | Wexler et al. . |
| 5,436,569 | 7/1995 | Melgaard ..................... 324/760 |
| 5,475,317 | 12/1995 | Smith . |
| 5,519,193 | 5/1996 | Freiermuth ..................... 437/8 |
| 5,646,540 | 7/1997 | Stals ........................... 324/760 |

*Primary Examiner*—Ernest F. Karlsen
*Assistant Examiner*—Jose M. Solis
*Attorney, Agent, or Firm*—Schmeiser, Olsen & Watts; Tiffany L. Townsend

[57] ABSTRACT

A test socket is provided as part of a high temperature electromigration test system to allow the prediction of median time to failure to temperatures in excess of 450° C. of VSLI interconnects.

9 Claims, 3 Drawing Sheets

5,760,595

HIGH TEMPERATURE ELECTROMIGRATION STRESS TEST SYSTEM, TEST SOCKET, AND USE THEREOF

FIELD OF THE INVENTION

The present invention relates to a test system for measuring the reliability of interconnects for very large scale (VLSI) integrated circuits at elevated temperatures. More particularly, the present invention relates to a high temperature test socket having electromigration test capabilities to temperatures in excess of 450° C.

BACKGROUND OF THE INVENTION

As the cross section of metal interconnects in integrated circuits continues to decrease and the resulting current density increases, failure of the metalization due to electromigration remains a concern. Conventially, failure due to electromigration, as shown by an open or short (extrusion), is evaluated by subjecting many samples to conditions of accelerated current and temperature. The resulting data are then extrapolated to use conditions. Because of the intense interest in improving reliability of very large scale integrated (VLSI) chip interconnects, process engineers have continuously searched for improved processes, new choices of metals, and combinations or alloys to improve electromigration lifetime. Although improved techniques have resulted, available tests can still require weeks or months to complete with existing stress equipment.

With the advent of copper metalization in integrated circuits, a new test procedure is needed to evaluate electromigration, because preliminary data has shown that copper lifetime can be at least 100× that of AlCu. During the performance of an integrated circuit chip (IC), an increase in current cannot be tolerated as a result of Joule heating, localized heating and hot spots. In addition, additional kinetic studies directed to evaluation of current, and temperature effects on width, grain size and length for metal stripes and vias at elevated temperatures are also needed. It would be desireable therefor to provide a test system for measuring electromigration stress and kinetics at temperatures up to 400° C.

SUMMARY OF THE INVENTION

The present invention is based on the discovery that a high temperature ceramic socket has been developed which will allow electromigration and kinetic studies of metal interconnects of a device, or devices under test (DUT) to a temperature in excess of 450° C. The high temperature socket can be employed in a suitable oven with the DUT; test results can be continuously monitored with a data acquistion system circuit external to the oven.

As used hereinafter, the expression, "DIP pins", or "dual in line package pins", means the package of leads electrically connected to specific areas of the DUT.

There is provided by the present invention, a test socket for providing electromigration studies for monitoring integrated circuit chips under stress to temperatures in excess of 450° C., which test socket comprises a first section having sufficient receiving slots for accepting DIP pins from a DUT, and a second section having sufficient receiving wells for positioning socket contact connectors for electrically engaging the DIP pins inserted in the first section and electrically joining such DIP pins to external monitoring equipment.

In a further aspect of the present invention, there is provided a high temperature electromigration stress test system for monitoring susceptibility to failure of at least one DUT to a temperatures in excess of 450° C., which system comprises, (A) an oven capable of providing a temperature in excess of 450° C., (B) a reusable test socket positioned in the oven to provide electrical connection between the DUT and a test circuit external to the oven, and (C) the test circuit of (B), comprising a computer equipped with software to continuously monitor and identify areas of electromigration stress of metal interconnects of the DUT to a temperature up to at least 400° C.

In a further aspect of the present invention, there is provided a method for measuring the reliability of product lifetime and performance degradation of a DUT in both wafer and package form comprising, subjecting such DUT to a temperature of in excess of 450° C. for a time sufficient to allow an external computer equipped with software to continuously monitor and identify areas of electromigration stress of metal interconnects.

BRIEF DESCRIPTION OF THE DRAWINGS

The features of the invention believed to be novel and the elements characteristic of the invention are set forth in the claims. The invention both as to organization and method of operation can be understood by reference to the detailed description which follows taken in conjunction with the drawings in which:

DETAILED DESCRIPTION OF THE PREFERRED EMBODIMENT(S)

Figure 1:
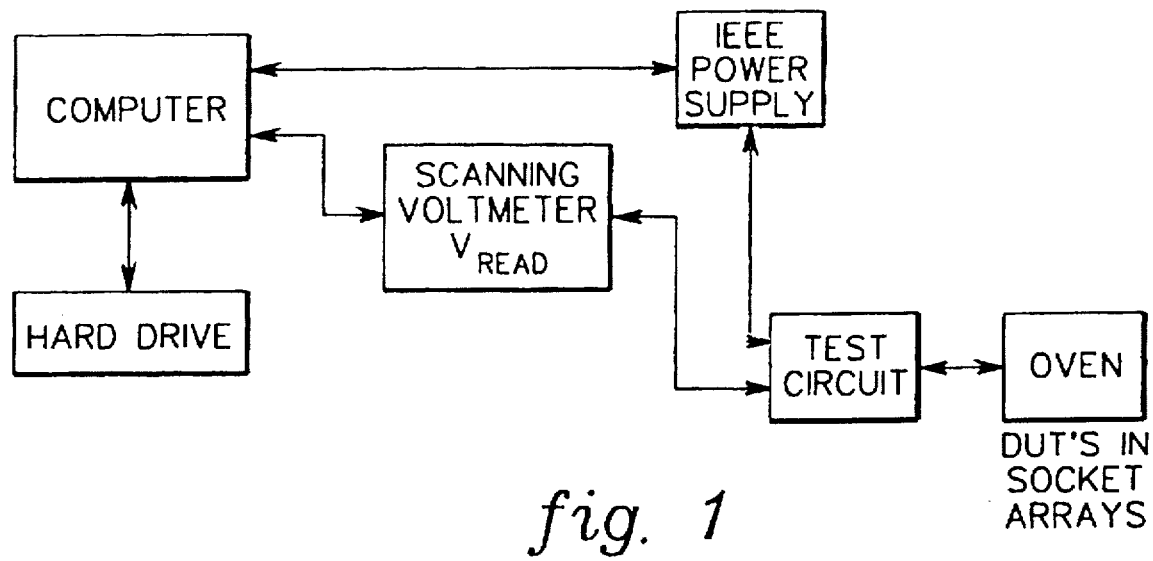
FIG. 1 is block diagram of a high temperature electromigration stress system.
Figure 2:
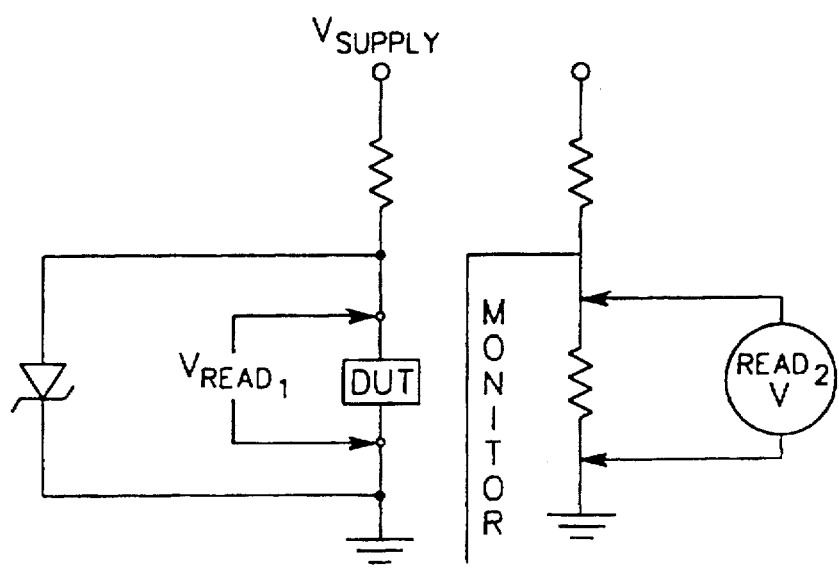
FIG. 2 is a schemetic of circuitry of a high temperature stress system.

There is shown more particularly in FIGS. 1 and 2, a computer system including a hard drive, and appropriate circuitry, in combination with an oven housing multiple packages of test devices (DUT'S) in combination with the high temperature sockets. Appropriate instrument cards can be used if programmed to temperatures in excess of 450° C.

An illustration of a system suitable for providing temperatures to 250° C. is shown by the PE9020 of the Micro Instrument CO of Escondido, Calif.

In FIG. 2, there is shown a preferred circuit system for monitoring electromigration performance of commercially available packaged devices. The value of $R_{DUT}$ can be calculated by determining the device test current based on the values of resistors used in the evaluation circuit, as initially computed. The $R_{DUT}$ is stored in the program at T/0 which is continuously scanned to calculate shifts in periodic cycles, an example being about 5 minutes. Unlike certain systems that use a dual purpose read/stress circuit, it is preferred to avoid a break in test conditions. A Zener diode can be used to protect from over voltage.

The system is also monitored for evidence of (extrusion) failure. For example, if extrusion occurs, the $V2_{read}$ will show a change from $T_{OE}$, which can be stored.

The socket of the present invention is preferably made from a precision engineered high temperature ceramic material. A suitable high temperature ceramic material is shown for example by U.S. Pat. No. 4,963,517, which is incorporated herein by reference.

Figure 3A:
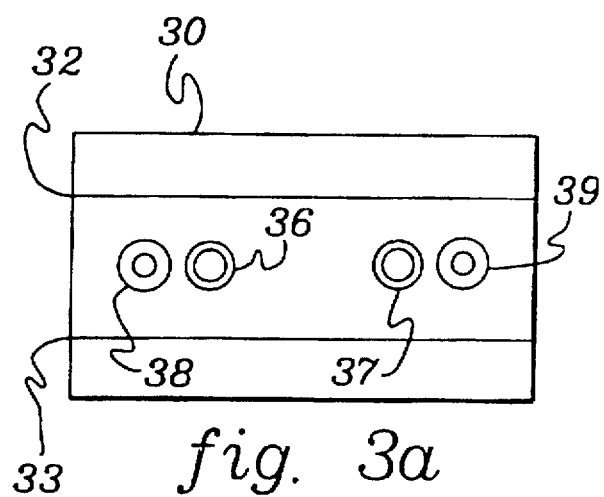
FIGS. 3a and 3b are schematics showing both sides of the upper section of the socket of a preferred embodiment of the present invention.
Figure 3B:
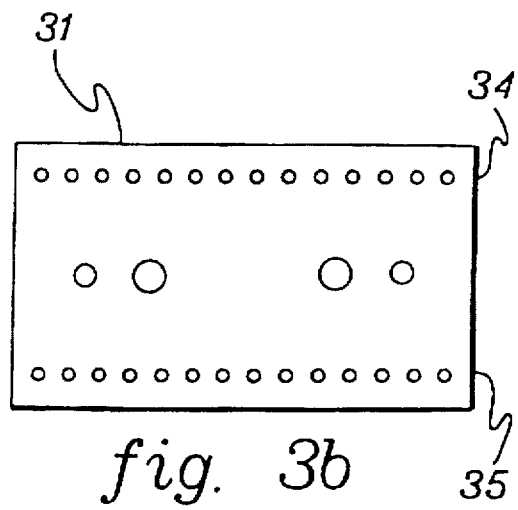
Figure 4A:
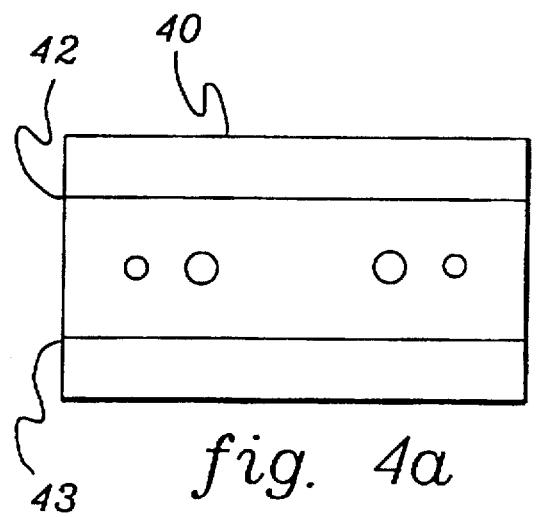
FIGS. 4a and 4b are schematics showing both sides of the lower section of the socket of a preferred embodiment of the present invention.
Figure 4B:
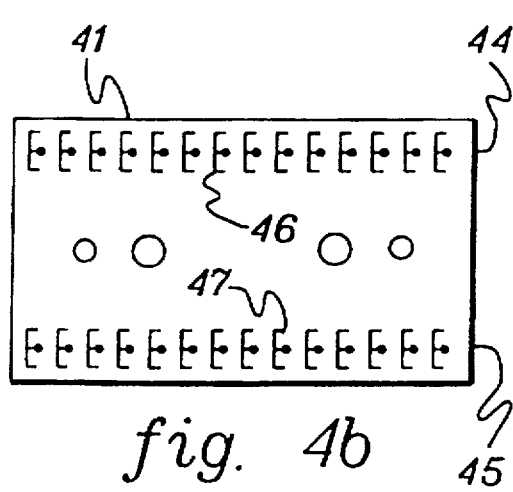

The socket can be made in two replaceable sections as illustrated in schematic in FIGS. 3a and 3b and FIGS. 4a and 4b. An upper socket section is shown in FIGS. 3a and 3b and a lower socket section is shown by FIGS. 4a and 4b.

More particularly, FIG. 3a at 30 shows the upper or outside view, and FIG. 3b at 31 shows the lower or inside views of the upper section of the two piece socket. Rows of slits for reception of DIP pins on the upper outside section of 30 are shown at 32 and 33; corresponding rows of recess wells are shown at 34 and 35 of FIG. 3b. These recess wells on the underside of the upper socket section at 31 can accomodate the female section of connecting pins which are more particularly illustrated in FIG. 5.

With further reference to FIG. 3a, mounting holes for screws or bolts for joining upper and lower socket sections are shown at 36 and 37; assembly holes for mounting the socket on temperature resistant assembly racks, such as a steel rack, in an oven, are shown at 38 and 39.

Figure 5:
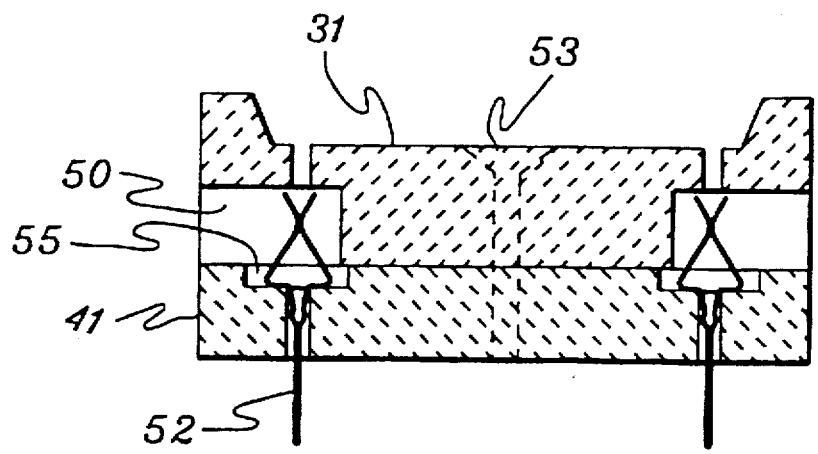
FIG. 5 is an end schematic showing the joining of the lower and upper section of the sockets in combination with socket contact pin receptacles for receiving DIP pins from a DUT.

Figs 4a and 4b are schematics of the outside at 40 and inside at 41 respectively of the lower section of the socket. Again, rows of slits are shown at 42 and 43, wells are shown at 44 and 45 for accomodating the base section of the connecting pin structure as illustrated in FIG. 5. In FIG. 5, there is shown an end view of the two socket sections with connecting pins. A phantom view of a screw hole is shown at 53. The connecting pins 52 can be made from gold plated Beryllium Nickel-Alloy, or equivalent high temperature material. A seat 55 is shown which is positioned above a well in the lower socket section 41. A cavity 50 is shown in the upper socket section 31.

Further features of the present invention are the use of high temperature annealed nickel wire having gold plating encased in fiberglass sleeving welded to the connecting pins.

Figure 6:
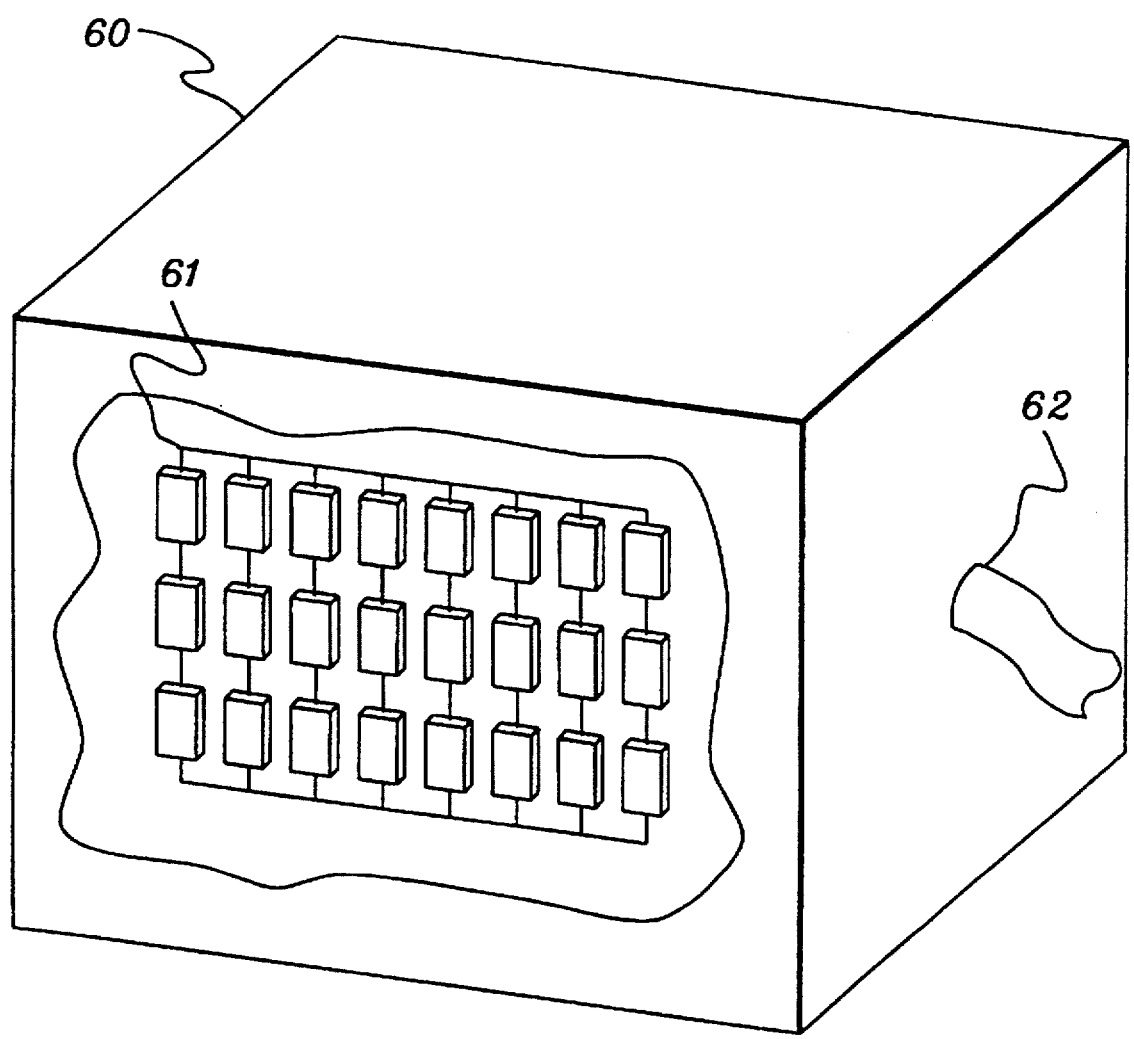
FIG. 6 is a view of an oven having a cut-out view of a an array of sockets.

FIG. 6 is an isometric view of an oven as shown at 60; an array of sockets is shown at 61, and a section of cable shown at 62 is connected to the test circuit shown in FIG. 1. The oven 60 is capable of a temperature in excess of 500° C.

What is claimed is:

1. A test socket for providing electromigration studies for monitoring integrated circuit chips under stress to temperatures in excess of 450° C., which test socket comprises a first section having sufficient receiving slots for accepting dual in-line package (DIP) pins from a device under test (DUT), and a second section having sufficient receiving wells for positioning socket contact pins for electrically engaging the DIP pins of the first section section and electrically joining such DIP pins to external monitoring equipment, and whose first section and second section can be readily separated or joined to each other by a connector and readily mounted when joined together.

2. A method for measuring the reliability of product lifetime and performance degradation of a DUT in both wafer and package form comprising, subjecting such DUT to a temperature in excess of 450° C. for a time sufficient to allow an external computer equipped with soft-ware to continuously monitor and identify areas of electromigration stress of metal interconnects, which method employs a reusable test socket includes a first and second section which can be readily separated or joined together and readily mounted when joined together.

3. A test socket in accordance with claim 1, which is made from a high temperature ceramic.

4. A test socket in accordance with claim 1, which have socket contact pins installed which can be used to engage DIP pins of a DUT.

5. A test socket in accordance with claim 4, where the contact pins are made of a high temperature beryllium-nickel alloy.

6. A test socket in accordance with claim 4, where high temperature annealed nickel wiring having gold plating encased in high temperature fiberglass sleeving is welded to the socket contact pins.

7. A high temperature electromigration stress test system for monitoring susceptibility to failure of at least one DUT to a temperature in excess of 450° C., which system comprises, (A) an oven capable of providing temperatures in excess of 450° C., (B) a reusable test socket for establishing electrical connection between the DUT and a test circuit external to the oven, where the reusable test socket includes a first and second section which can be readily separated or joined together and readily mounted when joined together.

(C) the test circuit of (B), comprising a computer equipped with software to continuously monitor and identify areas of electromigration stress of metal interconnects of the DUT to a temperature in excess of 450° C.

8. A stress test system in accordance with claim 7, where an oven is used capable of providing temperatures in excess of 500° C.

9. A stress test system in accordance with claim 7, where stainless steel racks are used in the oven to mount the test sockets.

* * * * *